United States Patent
Wu et al.

(10) Patent No.: US 6,933,203 B2
(45) Date of Patent: Aug. 23, 2005

(54) METHODS FOR IMPROVING WELL TO WELL ISOLATION

(75) Inventors: Zhiqiang Wu, Plano, TX (US); Shaoping Tang, Plano, TX (US); Jau-Yuann Yang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/299,525

(22) Filed: Nov. 19, 2002

(65) Prior Publication Data

US 2004/0097051 A1 May 20, 2004

(51) Int. Cl.$^7$ .............................................. H01L 21/00
(52) U.S. Cl. ..................................................... 438/400
(58) Field of Search ............................... 438/400, 414, 438/416, 418, 419, 420, 439, 449, 450, 451, 510, 526, 527, 529

(56) References Cited

U.S. PATENT DOCUMENTS

| | | | |
|---|---|---|---|
| 5,362,670 A | 11/1994 | Iguchi et al. | |
| 5,688,710 A | 11/1997 | Lu | |
| 5,831,313 A | * 11/1998 | Han et al. | 257/371 |
| 6,211,002 B1 | 4/2001 | Wu | |
| 6,228,726 B1 | 5/2001 | Liaw | |
| 6,291,323 B1 | 9/2001 | Gonzalez | |
| 6,294,416 B1 | 9/2001 | Wu | |

* cited by examiner

*Primary Examiner*—Evan Pert
(74) *Attorney, Agent, or Firm*—Jacqueline J. Garner; W. James Brady, III; Frederick J. Telecky, Jr.

(57) ABSTRACT

Methods are provided for forming wells in a semiconductor wafer, in which p-wells and n-wells are formed in a substrate, and first p-type dopants are implanted into n-well regions while an n-well mask remains over the wafer to selectively decrease a substrate resistivity in the n-well regions beneath the n-wells. A subsequent blanket implantation provides second p-type dopants into isolation regions of the substrate beneath isolation structures, where the first and second p-type dopants improve well to well isolation without addition of extra masks to the fabrication process.

25 Claims, 10 Drawing Sheets

METHODS FOR IMPROVING WELL TO WELL ISOLATION

FIELD OF INVENTION

The present invention relates generally to semiconductor devices and more particularly to methods for forming wells in a substrate in the manufacture of semiconductor devices.

BACKGROUND OF THE INVENTION

In the fabrication of semiconductor devices, isolation structures are formed in a wafer substrate between active areas in which electrical devices such as transistors, memory cells, or the like, are to be formed. The substrate is typically lightly doped with p-type dopants, and wells are formed in the upper portions of the active substrate regions. Thereafter, transistors may be formed in and above the wells, where source drain regions are formed in the wells by implantation of opposite dopant types. For example, in twin-well processes, n-wells and p-wells are formed by implanting n and p type dopants, respectively, into appropriate well regions of a lightly p-doped silicon substrate or an epitaxial silicon layer in a silicon-over-insulator (SOI) wafer. PMOS transistors are fabricated in the n-well regions by implanting p-type dopants in the n-wells to form PMOS source/drain terminals. Similarly, NMOS source/drains are formed by implanting n-type dopants into the p-wells.

In the operation of such devices, well to well electrical isolation is important to ensure proper operation of the transistor devices formed in the wells. Local oxidation of silicon (LOCOS) or shallow trench isolation (STI) techniques are commonly employed to form isolation structures between such adjacent wells. However, such isolation structures may not prevent leakage from one well to an adjacent well in all operating conditions. For instance, adjacent, non-contiguous n-wells may be biased differently in device operation, by which a voltage difference exists between the adjacent wells. If the voltage difference is large enough, well to well leakage may result, even where an isolation structure (e.g., LOCOS or STI) is located between the top portions of the wells. Where the well to well isolation is insufficient, the depletion regions in adjacent n-wells may merge together, resulting in undesirable punch-thru conditions and leakage between the adjacent n-wells.

The resistivity of the substrate material between adjacent wells plays an important role in determining the amount or likelihood of well to well leakage for a given biasing condition. In general, lower substrate resistivity (e.g., increased p-type substrate dopant concentration) provides improved isolation because more dopants are available to inhibit depletion region merging. Conversely, higher resistivity substrates (e.g., lower dopant concentration) are more susceptible to punch-thru leakage between adjacent n-wells. Accordingly, many CMOS devices are fabricated using low resistance p-doped silicon substrates, such as having a resistivity on the order of about 2 ohm-cm, to ensure appropriate well to well isolation.

However, certain applications call for higher substrate resistivity, such as in circuits which include RF components. For example, RF inductors may be fabricated in an RF region of a wafer, for which a high quality or "Q" factor is needed. A signal passing through the inductor will tend to induce a current in the substrate, causing a loss. The higher the substrate resistivity, the lower this loss will be. The Q factor is a measure of the amount of loss in the inductor, where a high Q factor indicates low loss. Accordingly, to facilitate manufacture of high Q (e.g., low loss) passive RF components, it is desirable to employ a relatively high resistivity p-doped silicon substrate, such as having a resistivity on the order of about 50 ohm-cm.

In mixed signal devices, both CMOS digital circuits and high frequency RF circuits are provided, wherein the RF components are built in an RF region and digital components are fabricated in other active areas of the wafer. In this situation, a tradeoff is required between low resistance p-doped silicon substrates (e.g., to help well to well isolation in the CMOS circuits) and high resistance substrates (e.g., to provide low loss passive RF components). However, such a tradeoff sacrifices one performance criteria in favor of the other. Accordingly, there remains a need for techniques by which well to well isolation may be improved without significantly impacting low loss passive RF components in a mixed-signal semiconductor device, and without adding significant processing time or expense to the manufacturing process.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for the formation of wells in a wafer, in which p-wells and n-wells are formed in a substrate, and first p-type dopants are implanted into n-well regions while an n-well mask remains over the wafer to selectively decrease a substrate resistivity in the n-well regions beneath the n-wells. This may be employed to improve well to well isolation, particularly in a high resistivity substrate. A subsequent blanket implantation may be employed to provide second p-type dopants into isolation regions of the substrate beneath isolation structures between the wells. The first and second p-type dopants may thus improve well to well isolation without addition of extra masks to the fabrication process, and without adversely impacting the loss characteristics of devices in an RF portion of the wafer.

According to one aspect of the invention, a method of forming wells in a substrate of a semiconductor wafer is provided. The method comprises forming a p-well in a p-well region of a substrate, forming an n-well in an n-well region, and selectively implanting first p-type dopants into the n-well region to selectively decrease a substrate resistivity in the n-well region of the substrate beneath the n-well, for improving isolation between adjacent n-wells. Second p-type dopants may be implanted into isolation regions of the substrate beneath STI or other type isolation structures to further improve well to well isolation. A first boron implantation process may be employed to selectively implant the first p-type dopants while an n-well mask overlies the wafer to cover the p-well and isolation regions of the substrate. With no masking or with selective masking exposing the isolation regions, a second boron implantation may be employed to provide the second p-type dopants beneath the isolation structures.

According to another aspect of the invention, a method is provided for forming wells in a semiconductor wafer, comprising forming an n-well mask over the wafer, which covers p-well and isolation regions and which exposes n-well regions of the wafer. N-type dopants are then implanted into the exposed n-well regions to form n-wells therein. Using the same mask, first p-type dopants are implanted in the exposed n-well regions while the n-well mask overlies the wafer. The mask is then removed, and second p-type dopants are implanted into the p-well regions, the n-well regions, and the isolation regions of the wafer, where the second p-type dopants may be implanted at an angle.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
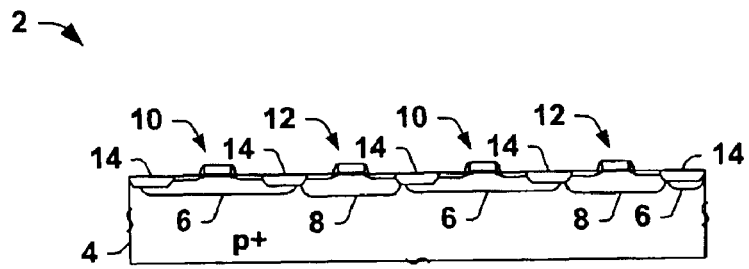
FIG. 1 is a partial side elevation view in section illustrating a conventional semiconductor device having n-wells and p-wells formed in a low resistivity silicon substrate.

The present invention will now be described with reference to the attached drawings, wherein like reference numerals are used to refer to like elements throughout. The invention relates to techniques allowing the use of high resistance substrates (e.g., p-doped silicon or epitaxial silicon in a BiCMOS or SOI process) to facilitate fabrication of low loss (e.g., high Q) passive RF components, while providing selective adjustment of the substrate resistivity in areas between adjacent wells to improve isolation therebetween. In order to better appreciate one or more advantages possible with the present invention, FIGS. 1–3 illustrate conventional semiconductor devices and the shortcomings associated with conventional processing techniques.

Referring initially to FIG. 1, a conventional semiconductor device 2 is illustrated with a low resistivity (e.g., 2 ohm-cm) silicon substrate 4 doped relatively heavily with boron or other p-type dopants. The illustrated portion of the device 2 includes p-wells 6 and n-wells 8 in which NMOS transistors 10 and PMOS transistors 12 are formed, respectively. The transistors 10 and 12 are isolated from one another by dielectric isolation structures 14, such as field oxide structures formed using LOCOS techniques, or STI structures. The NMOS transistors 10 are fabricated by doping source drain regions of the p-wells 6 with n-type dopants and forming gate structures over a channel between the source/drain regions. Source/drain regions of the n-wells 8 are doped with p-type impurities and gate structures are formed over channels therebetween to form the PMOS transistors 12. The low resistivity substrate 4 facilitates well to well isolation in CMOS circuitry in the device 2. However, the low substrate resistivity hinders the ability to fabricate low loss (e.g., high Q) RF passive components, such as inductors in the device 2.

Figure 2:
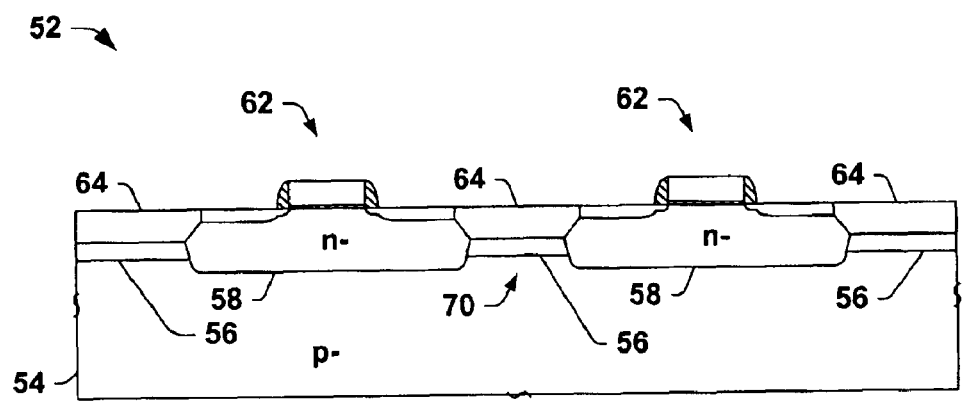
FIG. 2 is a partial side elevation view in section illustrating a conventional semiconductor device having adjacent n-wells in a high resistivity silicon substrate processed according to conventional techniques.
Figure 3:
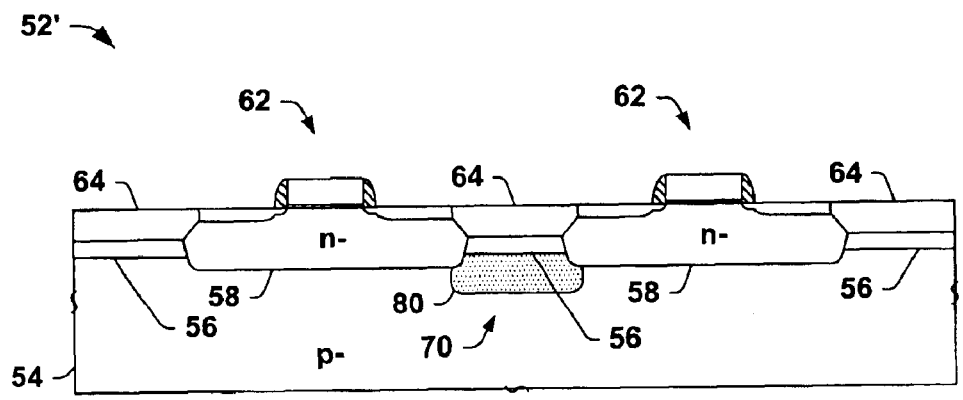
FIG. 3 is a partial side elevation view in section illustrating the device of FIG. 2 with an additional masked punch-thru implant fabricated according to conventional techniques.

Another conventional device 52 is illustrated in FIG. 2. In order to facilitate formation of lower loss RF components, the device 52 includes a higher resistivity (e.g., 50 ohm-cm) silicon substrate 54, which is lightly-doped with p-type impurities. The device 52 includes p-wells 56 and n-wells 58 in which NMOS transistors (not shown) and PMOS transistors 62 are formed, respectively. In the illustrated portion, PMOS transistors 62 are formed in adjacent n-wells 58, separated by an STI isolation structure 64. A portion of a p-well 56 underlies the isolation structure 64 separating the adjacent n-wells 58. However, beneath the isolation structure 64 and the p-well 56 is a region 70 of the substrate 54 separating the adjacent n-wells 58, consisting of silicon lightly doped with p-type impurities, which has a dopant concentration of about 1E14 $cm^{-3}$, with a relatively high resistivity of about 50 ohm-cm.

Although this higher resistivity of the substrate 54 facilitates the provision of high Q RF components (not shown) elsewhere in the device 52, the inventors have found that the region 70 is a potential weak point where punch-thru leakage may occur when the adjacent n-wells 58 are differently biased. One possible solution is illustrated in FIG. 3, where an additional punch-thru implantation has been performed in a device 52' using an extra mask (not shown) to provide additional p-type dopants in a portion 80 of the region 70 between the n-wells 58. This punch-thru implant portion 80 is believed to strengthen the n-well to n-well isolation by inhibiting the tendency of depletion regions in the adjacent n-wells 58 to merge when the n-wells 58 are differently biased. Although this approach may provide some relief to the tradeoff between well to well isolation and the provision of high Q RF components, the device 52' in FIG. 3 requires the expense and processing time associated with an additional mask for the punch-thru implantation.

The present invention provides methods for forming wells in a semiconductor wafer, which may be employed in semiconductor devices employing high resistance substrates (e.g., p-doped silicon or epitaxial silicon in an SOI process) to facilitate fabrication of low loss (e.g., high Q) passive RF components, while also providing selective adjustment of the substrate resistivity in areas between adjacent wells to improve isolation therebetween, without extra processing masks. In this manner, one or more aspects of the invention may be employed to avoid some of the tradeoffs mentioned above, without the extra expense associated with the device 52' of FIG. 3.

The invention involves the formation of wells in a wafer, in which p-wells and n-wells are formed in a substrate, and first p-type dopants, such as boron, are implanted into n-well regions while an n-well mask remains over the wafer to selectively decrease a substrate resistivity in the n-well regions beneath the n-wells. A subsequent blanket implantation may be employed to provide second p-type dopants into isolation regions of the substrate beneath isolation structures, where the first and second p-type dopants improve well to well isolation without addition of extra masks to the fabrication process, and without significantly degrading high Q passive RF components. Although illustrated and described hereinafter in the context of mixed-mode devices comprising lightly-doped (e.g., high resistivity) p-type silicon substrates, the invention is not limited to such applications, and may be employed in association with other devices employing different substrates, substrate dopant concentrations, and SOI devices.

Figure 4:
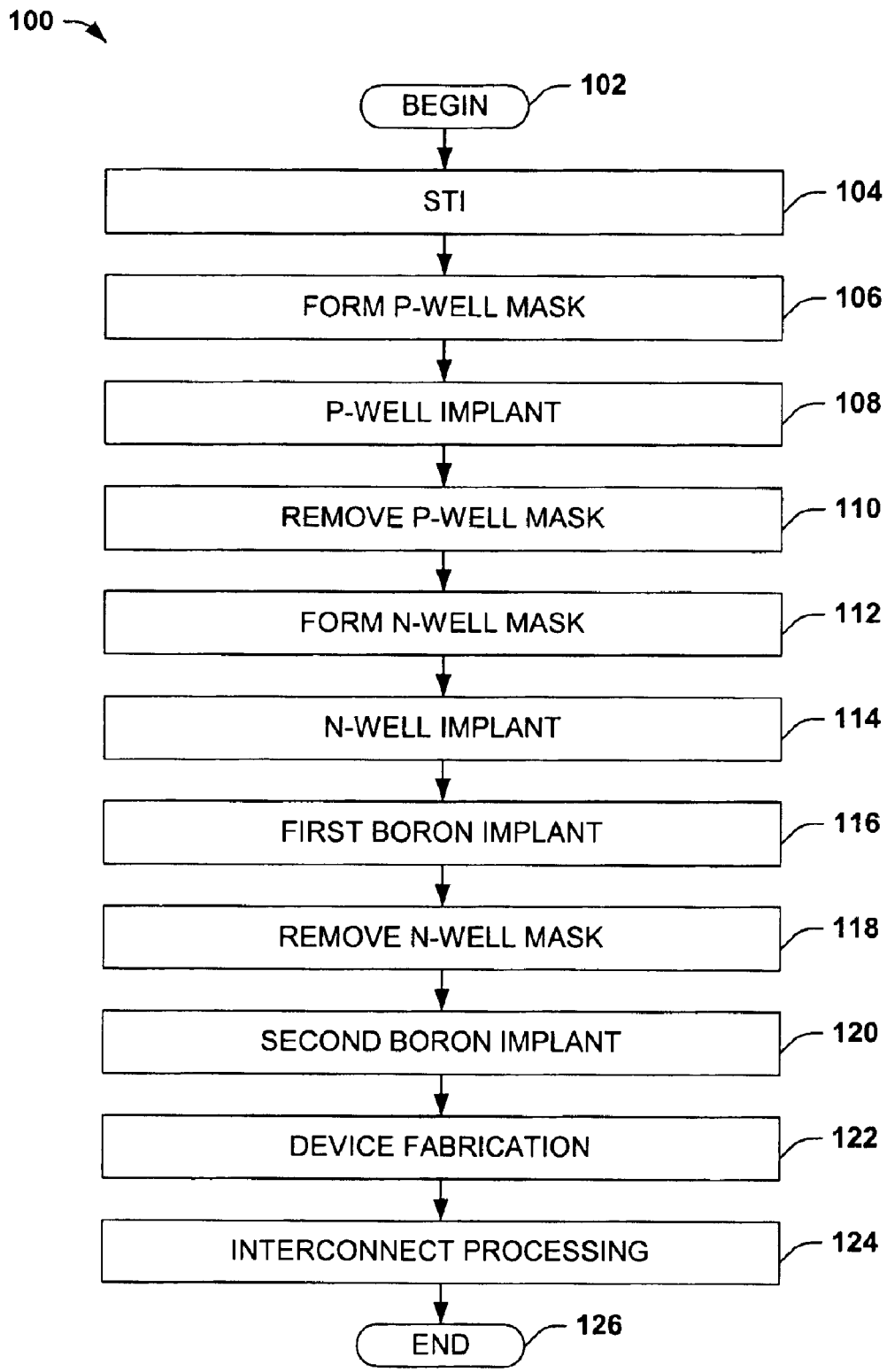
FIG. 4 is a flow diagram illustrating an exemplary method in accordance with one or more aspects of the present invention.

Referring now to FIG. 4, an exemplary method 100 is illustrated in accordance with the present invention. Although the method 100 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication and/or processing of semiconductor device structures illustrated and described herein as well as in association with other structures not illustrated.

Beginning at 102, the exemplary method 100 comprises forming an STI or other type isolation structure in an isolation region of a wafer at 104. STI isolation techniques involve the formation of shallow trenches in the isolation areas or regions of a semiconductor wafer, which are subsequently filled with dielectric material such as silicon dioxide ($SiO_2$) to provide electrical isolation between devices subsequently formed in the active regions on either side of the filled trenches. Alternatively, LOCOS or other techniques may be employed at 104 to form isolation structures in the wafer. At 106, a p-well mask is formed over the wafer, covering an n-well region and an RF region, and exposing a p-well region and isolation regions of the wafer. A p-well implant is performed at 108 to selectively implant p-type dopants into the exposed p-well region while the p-well mask overlies the wafer. In the p-well implant at 108 may also provide dopants in the isolation regions, such as beneath the STI isolation structures thereof. In one example, this implant at 108 involves implanting boron to a depth of about 1–3 $\mu$m at about 100–300 keV energy and a dosage of about 2E13–8E13 $cm^{-2}$.

The p-well mask is removed at 110, such as using a resist ashing or other resist stripping operation. An n-well mask is then formed over the wafer at 112, to cover the p-well region, the isolation region, and the RF region of the wafer, leaving the n-well region of the wafer exposed. N-type dopants are then selectively implanted at 114 into the exposed n-well region while the n-well mask overlies the wafer. In one example, phosphorus is implanted at 114 to a depth of about 1–3 $\mu$m at about 200–600 keV energy with a dosage of about 2E13–8E13 $cm^{-2}$.

In accordance with an aspect of the invention, first p-type dopants are selectively implanted at 116 into the exposed n-well region while the n-well mask overlies the wafer. The n-well mask is then removed at 118, such as using another resist ashing or stripping operation. Another aspect of the invention provides for implanting second p-type dopants into the isolation region, and possibly also into the p-well region, the n-well region, and the RF region of the wafer at 120, such as performing a second boron implantation with no masking. Active and passive components (e.g., transistors, diodes, resistors, capacitors, inductors, etc.) are then fabricated at 122 and interconnected at 124 according to semiconductor processing techniques as are known, before the exemplary method 100 ends at 126.

The selective implantation of first p-type dopants at 116 may comprise any appropriate implantation operation using boron (B), gallium (Ga), indium (In) or other p-type dopant species, using any available implantation apparatus operated at appropriate energy and dosage. As illustrated in FIG. 6D below, the implantation at 116 may advantageously be employed to provide a tail shaped region of p-doped silicon beneath the n-wells in an n-well region of the wafer. The inventors have found that this implantation may provide an enhanced channeling tail region beneath the n-wells to mitigate depletion region merging between adjacent n-wells, to thereby prevent or inhibit punch-thru leakage conditions during device operation.

In one example, the implantation at 116 provides a p-type dopant concentration of about 1E15 $cm^{-3}$ to 1E16 $cm^{-3}$ beneath the n-wells for this purpose, without changing the substrate resistivity in the RF regions of the wafer. In this regard, the invention may advantageously facilitate dopant concentration adjustment in and around the n-well regions using the existing n-well mask (e.g., which covers the RF regions), by which lightly doped, high resistivity (e.g., about 50 ohm-cm) substrates may be used to facilitate fabrication of low loss RF components in the masked RF region. The second p-type dopant implant at 120 may be performed as a blanket implantation (e.g., with no resist masking) to provide second p-type dopants (e.g., B, Ga, In, or others) into isolation regions of the substrate beneath isolation structures, where the first and second p-type dopants improve well to well isolation without addition of extra masks to the fabrication process.

In one exemplary implementation, the first p-type implant at 116 comprises performing a first boron implantation process while the n-well mask overlies the wafer to selectively provide first boron dopants to the exposed n-well regions of the wafer. In this example, the first boron implantation process comprises a first implantation energy of about 500 keV or more and about 800 keV or less, preferably about 550 keV, and a first dosage of about 1E12 $cm^{-2}$ or more and about 6E12 $cm^{-2}$ or less, preferably about 3E12 $cm^{-2}$. The implantation of second p-type dopants at 120 in this example comprises performing a second boron implantation process after removing the n-well mask using a second dosage different from that of the first implant at 116. In this implementation, the second implant at 120 comprises implanting boron dopants at a second implantation energy of about 300 keV or more and about 600 keV or less, preferably about 450 keV, and a second dosage of about 5E11 $cm^{-2}$ or more and about 2E12 $cm^{-2}$ or less, preferably about 1E12 $cm^{-2}$. Moreover, the second implant at 120 may be performed at an angle of about 4 degrees or more and about 7 degrees or less with respect to the wafer.

In another possible implementation, the first boron implant at 116 comprises a first implantation energy of about 300 keV or more and about 600 keV or less, preferably about 450 keV, and a first dosage of about 1E12 $cm^{-2}$ or more and about 6E12 $cm^{-2}$ or less, preferably about 3E12 $cm^{-2}$. In this example, the second boron implantation process at 120 comprises a second implantation energy of about 500 keV or more and about 800 keV or less, preferably about 550 keV, and a second dosage of about 5E11 $cm^{-2}$ or more and about 2E12 $cm^{-2}$ or less, preferably about 1E12 $cm^{-2}$. Many other specific implementations are possible, using other process parameters and dopant species within the scope of the invention, wherein it will be understood that the invention is not limited to the specific examples illustrated and described herein.

It will also be appreciated that where the wafer comprises a high resistivity substrate with an RF region, the n-well mask will typically cover the RF region, the p-well regions, and the isolation regions of the wafer, thus preventing the first implant at 116 from adversely impacting the high substrate resistivity (e.g., about 50 ohm-cm) in the RF region. Removing the n-well mask may expose the RF region, wherein the second boron implantation process at 120 provides a certain amount of p-type dopants to the RF region. However, in this and other implementations, the p-type dopant concentration in the RF regions may be controlled by the dosage and energy of the second boron implant at 120 so as to have minimal effect of the Q factor or losses of RF components therein. In the above implementation, for example, the inventors have found that the second boron dosage of about $2E12$ $cm^{-2}$ or less will degrade the Q factor of RF inductor components by only about 6% for a 50 ohm-cm initial substrate resistivity.

It is further noted with respect to the exemplary method 100 and other methods according to the invention, that the ordering of the n-well implant at 114 and the first boron implant at 116 may be reversed, and/or that the p-well masking and implantation acts of 106–110 may alternatively be performed before or after the acts of 112–120. Moreover, the isolation structures may be formed at 104 using LOCOS, STI or any other appropriate techniques, wherein the acts at 104 may be performed before or after well formation. In addition, it will be appreciated that one or more thermal dopant activation anneal acts (not shown) may be performed at any appropriate point in the methods of the invention, wherein these acts are omitted from the description so as not to obscure the various aspects of the invention.

Many alternative implementations are thus possible, in which first p-type dopants are selectively implanted into the n-well region to selectively decrease a substrate resistivity in the n-well region of the substrate beneath the n-well, wherein the exemplary implementations illustrated and described above require no additional masks. Further, the second p-type dopant implantation (e.g., at 120 in the method 100) may, but need not, be a blanket (e.g., unmasked) process. Thus, the invention contemplates any techniques wherein second p-type dopants are implanted into the isolation region of the substrate beneath the isolation structure, which may or may not be performed at an angle with respect to the wafer. Moreover, the depths and concentration gradients in the regions implanted with the first and second p-type dopants at 116 and 120, respectively, may be tailored according to respective depths of n-wells and isolation structures for a given device design within the scope of the present invention.

Figure 5:
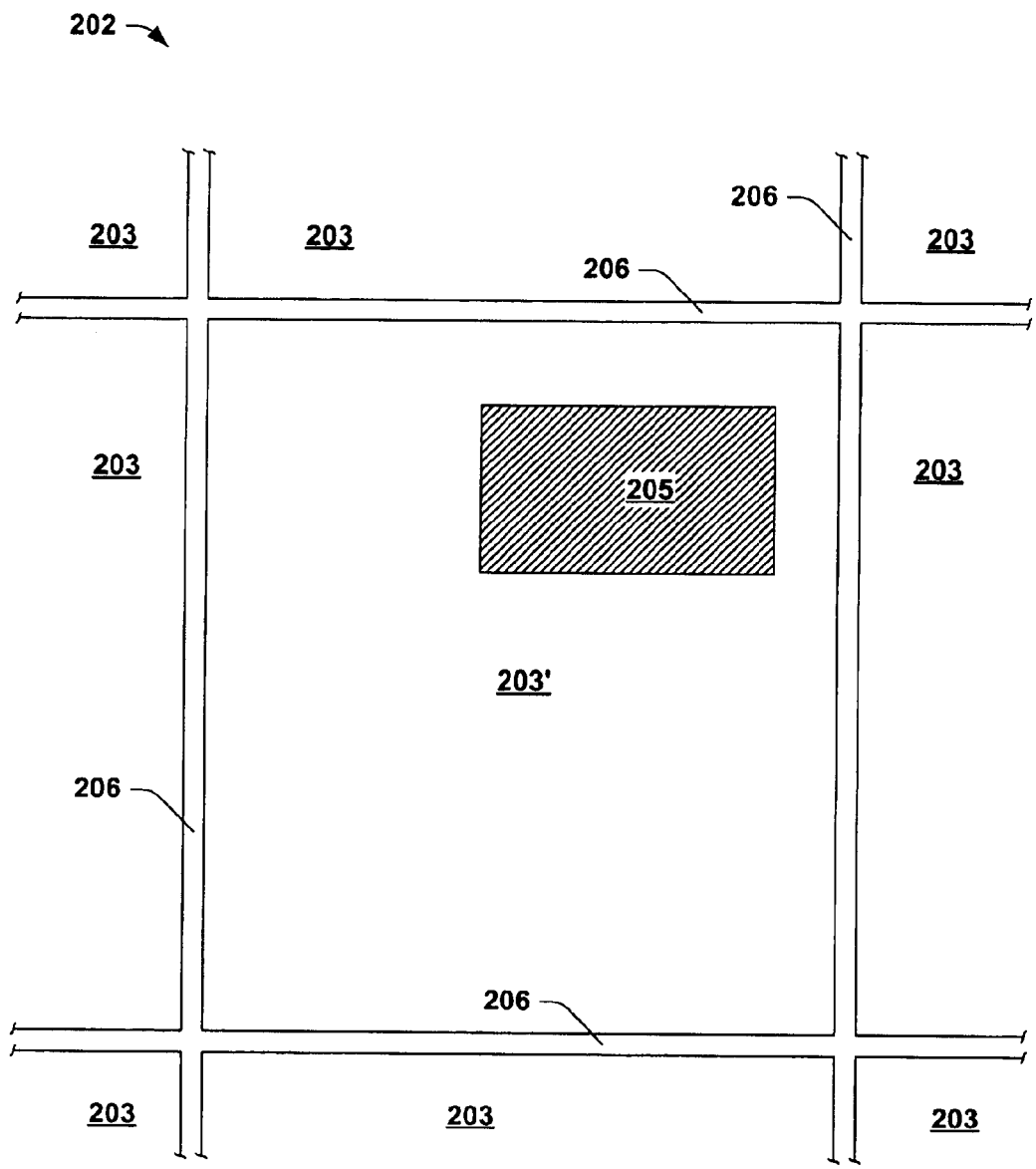
FIG. 5 is a top plan view illustrating a portion of an exemplary semiconductor wafer in which one or more aspects of the invention may be carried out, and which comprises several die regions with an RF region in one of the die regions.
Figure 6A:
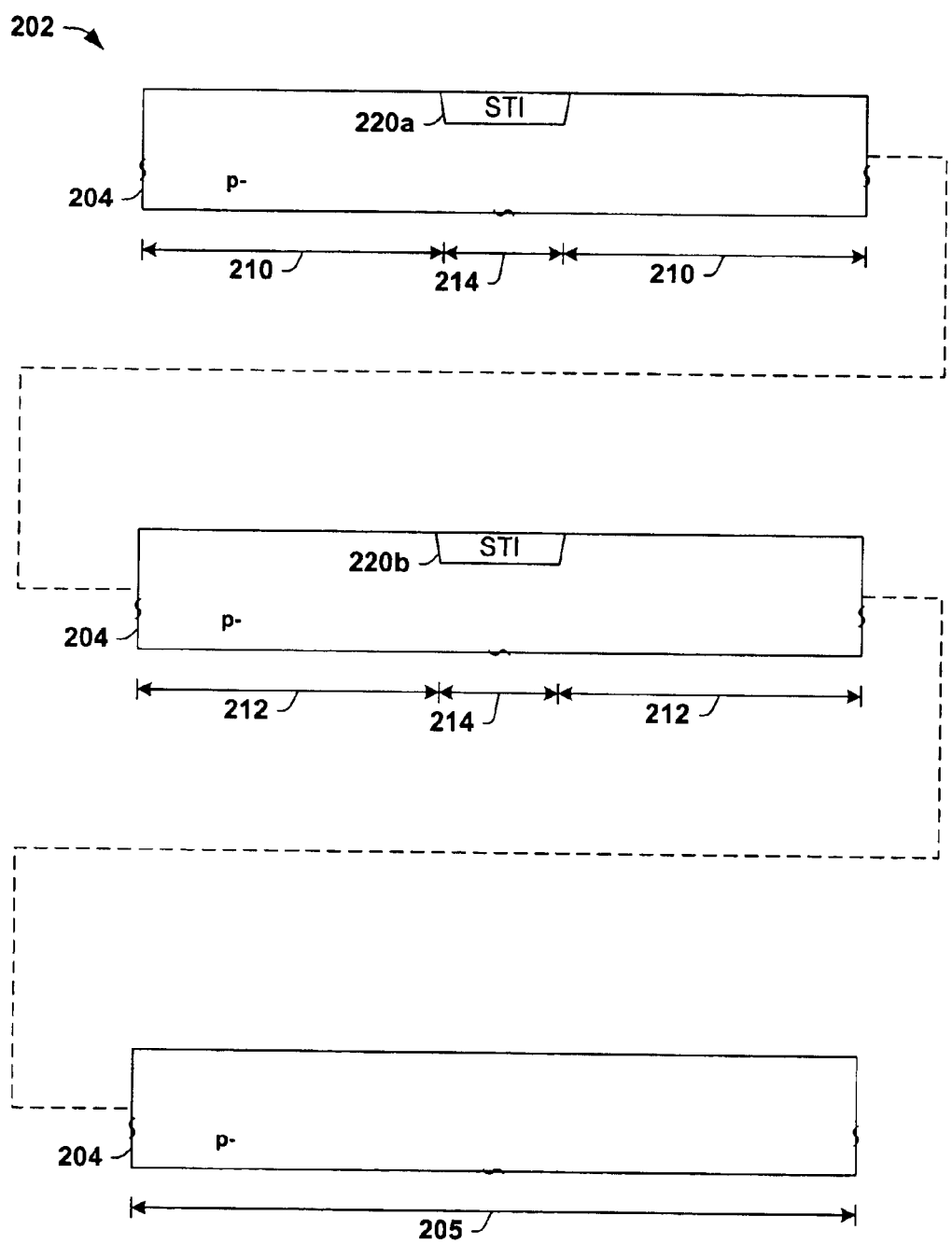
FIGS. 6A–6H are partial side elevation views in section illustrating processing of an exemplary wafer to form isolation structures, n-wells, and p-wells in the substrate in accordance with the invention.
Figure 6B:
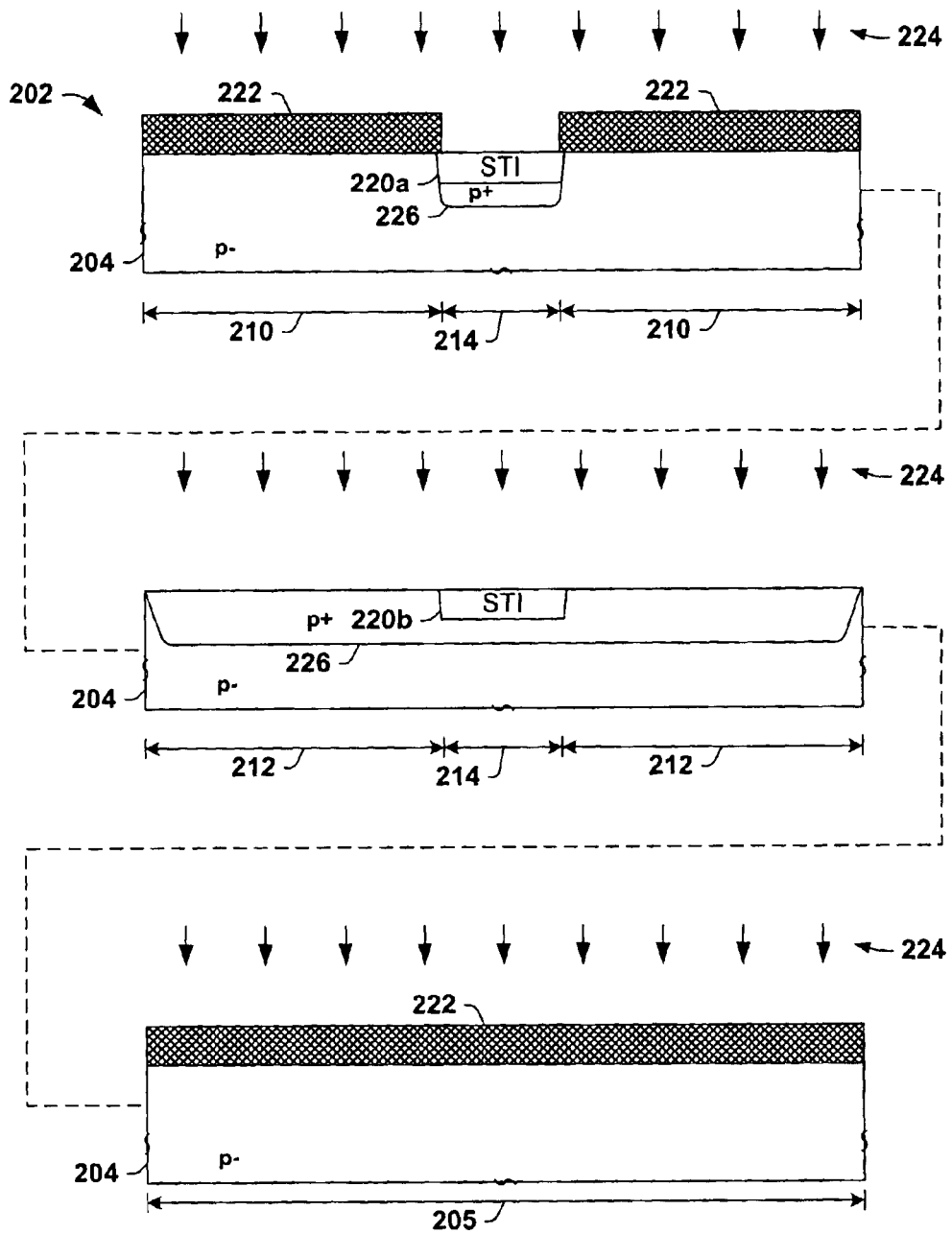
Figure 6C:
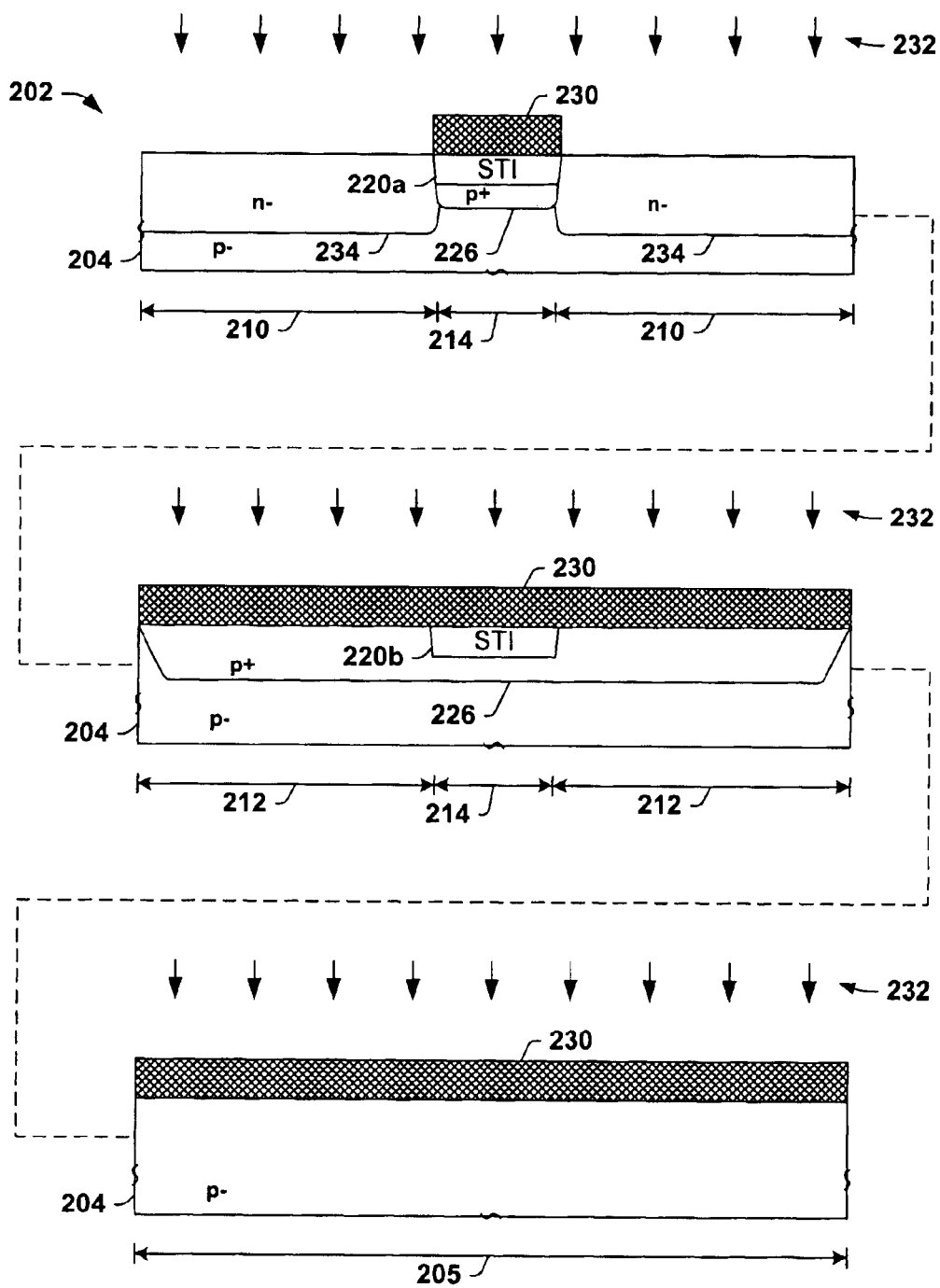
Figure 6D:
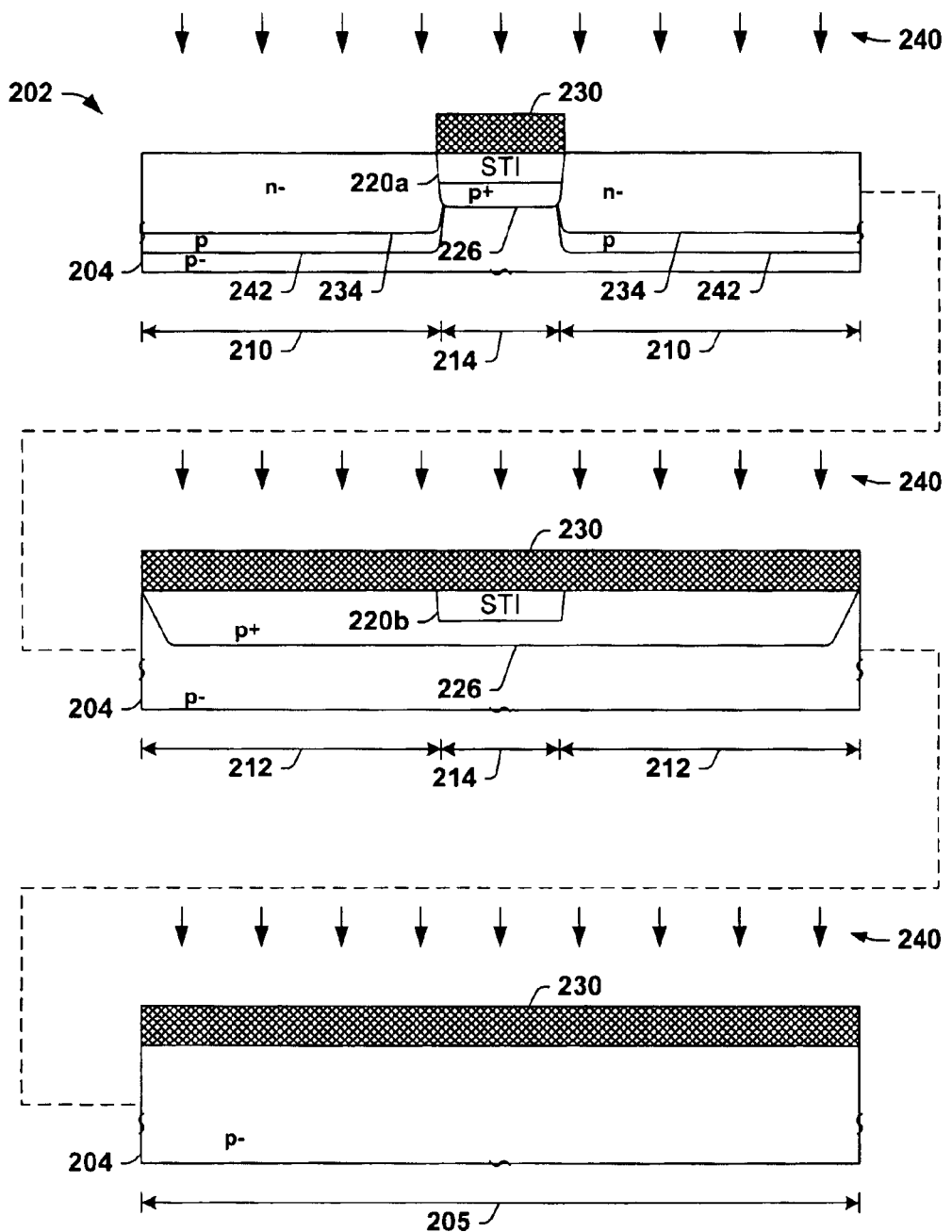
Figure 6E:
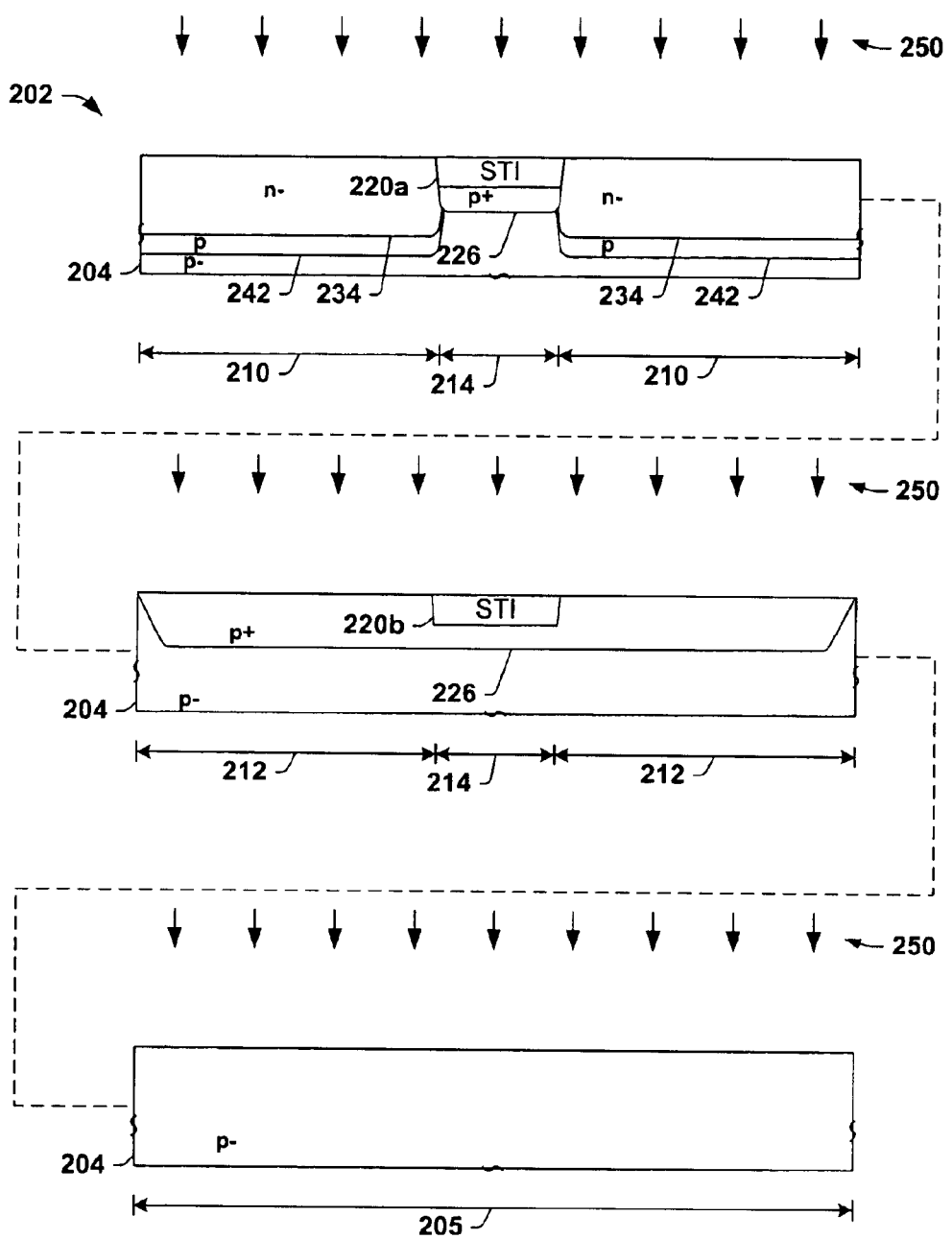
Figure 6F:
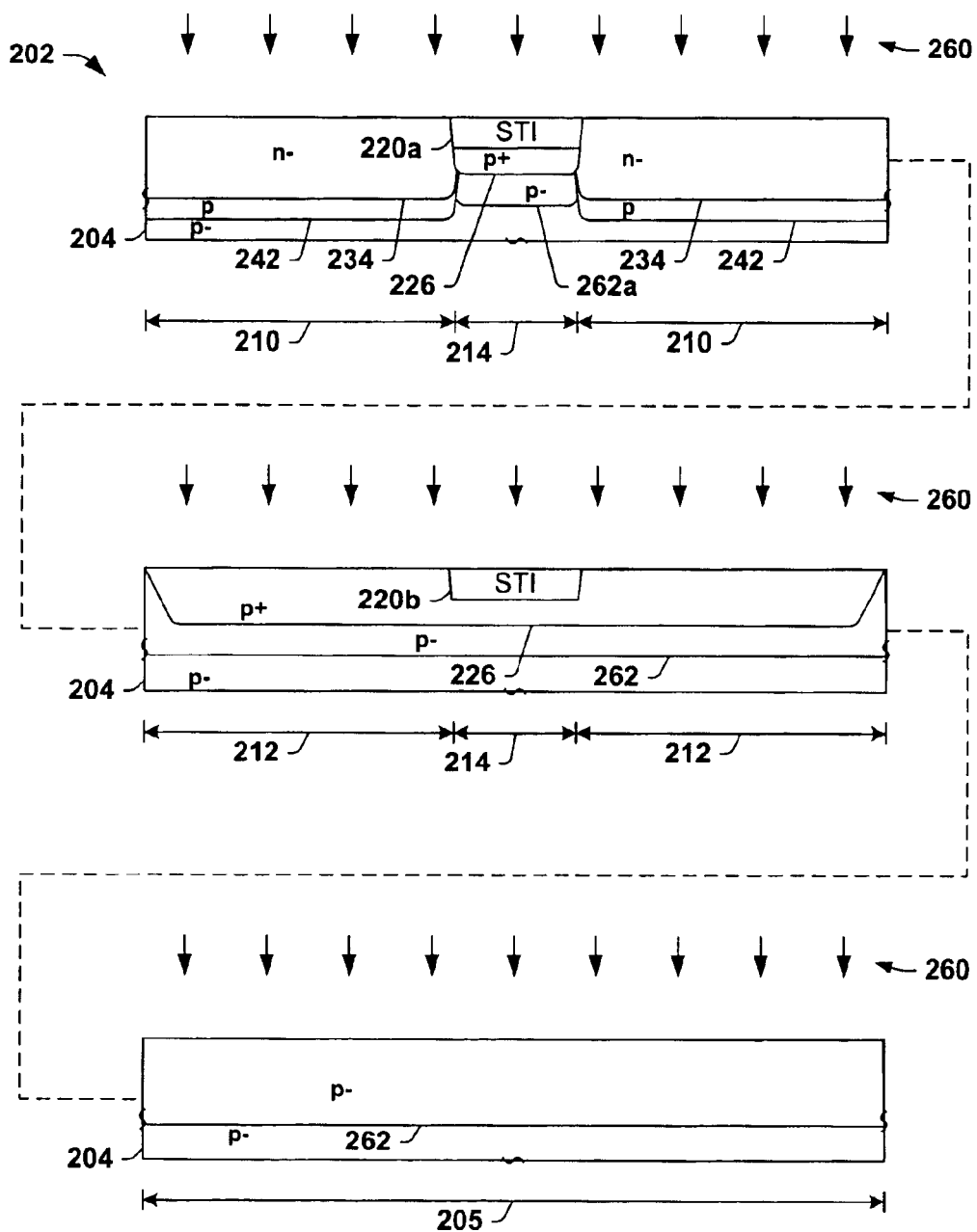
Figure 6G:
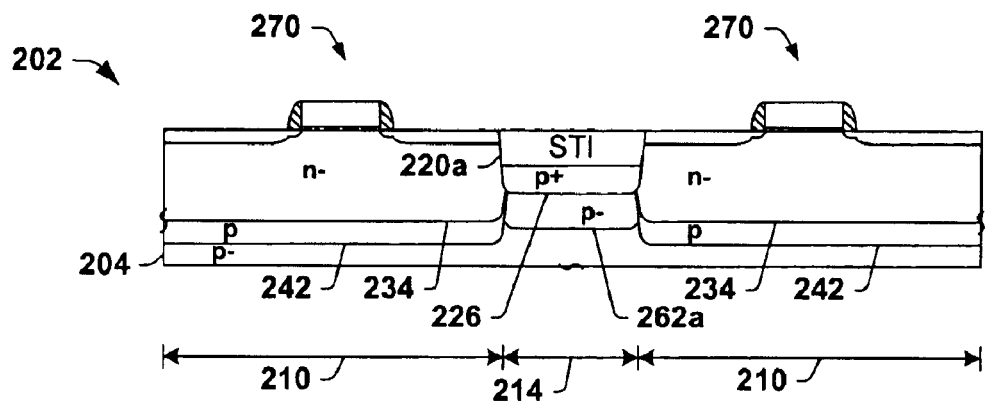
Figure 6H:
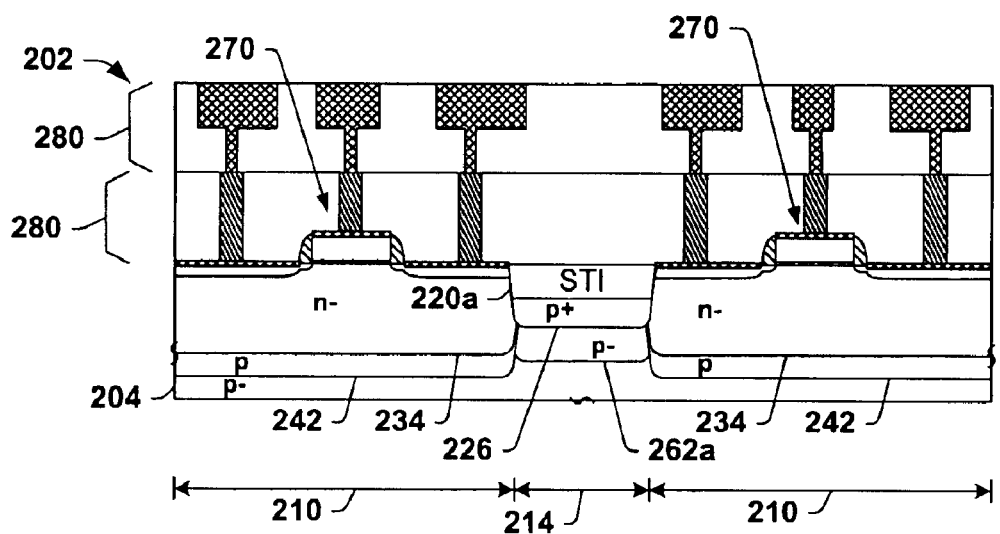

Referring now to FIGS. 5–6H, an exemplary semiconductor wafer 202 is illustrated in which one or more aspects of the invention may be carried out, and which comprises several die regions 203 with an RF region 205 in one exemplary die region 203'. In FIG. 5, a top plan view of a portion of the wafer 202 is illustrated, wherein multiple die regions 203 are separated by scribe line regions 206, along which individual die may thereafter be separated following processing according to the invention. The RF region or island 205 is employed for formation of RF or other analog components and the remainder of the die region 203' is used for digital and other devices, including CMOS transistor circuitry, wherein more than one such RF region 205 may be provided in a given die area 203. The exemplary wafer 202, moreover, comprises a p-doped silicon substrate 204 having a relatively high initial resistivity (e.g., about 50 ohm-cm) so as to facilitate fabrication of low loss (e.g., high Q) inductors and other RF components in the RF region 205. However, it is noted that the methods of the invention may be employed in association with other wafers comprising SOI structures, and those having more heavily doped (e.g., lower resistivity) substrates.

FIGS. 6A–6H illustrate processing of the exemplary wafer 202 to form isolation structures, n-wells, and p-wells in the substrate 204 in accordance with the invention, for example, the method 100 above. The die region 203' (FIG. 5) includes active regions in which electrical devices are fabricated, as well as one or more RF regions 205, n-well regions 210, p-well regions 212, and isolation regions 214, wherein p-well implantation acts may provide p-wells extending into the isolation regions 214. In FIG. 6A, two STI isolation structures 220a and 220b are formed in the substrate 204, wherein the STI structure 220a separates two adjacent n-well regions 210 and the structure 220b lies between p-well regions 212. One or more such isolation structures may also be formed in the RF region 205, although not shown in the illustrated portion thereof. LOCOS or other types of isolation structures may alternatively be formed in the isolation regions 214 to separate active regions of the wafer 202.

In FIG. 6B, a p-well mask 222 is formed over the wafer 202, via any appropriate photolithographic masking and patterning techniques as are known. The exemplary p-well mask 222 is patterned to cover the n-well regions 210 and the RF regions 205 of the wafer 202, while leaving the p-well regions 212 and the isolation regions 214 exposed. Alternative implementations are also possible wherein the p-well mask 222 also covers the isolation regions 214, leaving only the p-well regions 212 exposed. A p-well implantation process 224 is then performed to implant p-type dopants into the exposed p-well regions 212 and the isolation regions 214 to form p-wells 226. It is noted that the p-wells 226 in the exemplary wafer 202 extend vertically beneath the STI structures 220a and 220b, and do not extend into the covered RF region 205. The p-well mask 222 is then removed using an ashing operation (not shown).

Thereafter in FIG. 6C, an n-well mask 230 is formed over the wafer 202, covering the isolation regions 214, the p-well regions 212, and the RF regions 205 of the wafer 202. An n-well implantation process 232 is then employed to implant n-type dopants (e.g., phosphorus (P), arsenic (As), antimony (Sb), or others) into the n-well regions 210 to form n-wells 234 in the p-doped substrate 204. In FIG. 6D, with the n-well mask 230 remaining over the wafer 202, a first p-type implantation process 240 is performed to provide first p-type dopants (e.g., B, Ga, In, or others) into the exposed n-well regions 210, wherein the implanted first p-type dopants extend beneath the n-wells 234 in tail portions 242 of the substrate 204.

In the exemplary wafer 202, the first p-type dopants comprise boron impurities providing a p-type dopant concentration of about $1E15$ to about $1E16$ $cm^{-3}$ beneath the n-wells 234 in the n-well regions 210, although other concentrations are possible in the tails 242. In this example, the implantation process 240 employs an implant energy of about 500–800 keV and a dosage of about $1E12$–$6E12$ $cm^{-2}$. In another possible implementation, the implant 240 employs an energy of about 300–600 keV and an implantation dosage of about $1E12$–$6E12$ $cm^{-2}$. In FIG. 6E, an ashing process 250 is employed to remove the n-well mask 230, thereby exposing the wafer regions 210, 212, 214, and 205.

With the isolation regions 214 (e.g., and the other regions 210, 212, and 205) exposed, a second p-type implantation process 260 is employed in FIG. 6F to form regions 262 doped with second p-type dopants (e.g., B, Ga, In, or others). In this example, a region 262a is formed under the p-well 226 beneath the STI isolation structure 214 in the region 214 between the adjacent n-well regions 210. In the illustrated example, the second p-type dopants are boron implanted at an energy of about 300–600 keV and a dosage of about 5E11–2E12 cm$^{-2}$, wherein the process 260 may optionally be performed at an angle of about 4–7 degrees with respect to the wafer 202. In another possible implementation, the process 260 employs an energy of about 500–800 keV and a dosage of about 5E11–2E12 cm$^{-2}$.

Other implementations (not shown) are also possible within the scope of the invention. For example, the second p-type (e.g., boron) implantation 260 may be omitted. Alternatively, the second p-type implant need not be a blanket (e.g., unmasked) implantation process, wherein the second p-type dopants are selectively provided into the region 262a with one, some, or all of the nonisolation portions 210, 212, and/or 205 covered (e.g., such as using the p-well mask 222 of FIG. 6B). However, it is noted that the exemplary implementation in the wafer 202 requires no additional masks. Referring also to FIGS. 6G and 6H, PMOS transistors 270 may then be fabricated in the n-wells 234, and one or more interconnect layers or structures 280 may be fabricated in the wafer 202 using any appropriate semiconductor device fabrication processing techniques.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming wells in a semiconductor wafer, comprising:
   forming an n-well mask over the wafer, the n-well mask covering p-well regions of the wafer and isolation regions of the wafer and exposing n-well regions of the wafer;
   selectively implanting n-type dopants into exposed n-well regions of the wafer while the n-well mask overlies the wafer; and
   selectively implanting first p-type dopants into the exposed n-well regions while the n-well mask overlies the wafer.

2. The method of claim 1, further comprising implanting second p-type dopants into the p-well regions, the n-well regions, and the isolation regions of the wafer.

3. The method of claim 2, wherein implanting the second p-type dopants into the p-well regions, the n-well regions, and the isolation regions comprises:
   removing the n-well mask after selectively implanting the first p-type dopants to expose the p-well regions, the n-well regions, and the isolation regions of the wafer; and
   implanting the second p-type dopants into exposed p-well regions, n-well regions, and isolation regions after removing the n-well mask.

4. The method of claim 3, wherein selectively implanting the first p-type dopants comprises performing a first boron implantation process while the n-well mask overlies the wafer to selectively provide first boron dopanis to the exposed n-well regions of the wafer, and wherein implanting second p-type dopants comprises performing a second boron implantation process after removing the n-well mask to provide second boron dopants to the exposed p-welt regions, n-well regions, and isolation regions.

5. The method of claim 4, wherein the first boron implantation process comprises a first dosage, wherein the second boron implantation process comprises a second dosage, and wherein the first dosage is different from the second dosage.

6. The method of claim 4, wherein performing the first boron implantation process comprises providing a p-type dopant concentration of about 1E15 cm$^{-3}$ or more and about 1E16 cm$^{-3}$ or less beneath an n-well in an n-well region of the wafer.

7. The method of claim 4, wherein the first boron implantation process comprises a first implantation energy of about 500 keV or more and about 800 keV or less and a first dosage of about 1E12 cm$^{-2}$ or more and about 6E12 cm$^{-2}$ or less.

8. The method of claim 7, wherein the first boron implantation process comprises a first implantation energy of about 550 keV and a first dosage of about 3E12 cm$^{-2}$.

9. The method of claim 7, wherein the second boron implantation process comprises a second implantation energy of about 300 keV or more and about 600 keV or less, and a second dosage of about 5E11 cm$^{-2}$ or more and about 2E12 cm$^{-2}$ or less.

10. The method of claim 4, wherein the second boron implantation process comprises a second implantation energy of about 300 keV or more and about 600 keV or less, and a second dosage of about 5E11 cm$^{-2}$ more and about 2E12 cm$^{-2}$ or less.

11. The method of claim 10, wherein the second boron implantation process comprises a second implantation energy of about 450 keV, and a second dosage of about 1E12 cm$^{-2}$.

12. The method of claim 10, wherein the second implantation process is performed at an angle of about 4 degrees or more and about 7 degrees or less with respect to the wafer.

13. The method of claim 4, wherein the second implantation process is performed at an angle of about 4 degrees or more and about 7 degrees or less with respect to the wafer.

14. The method of claim 4, wherein the first boron implantation process comprises a first implantation energy of about 300 keV or more and about 600 keV or less and a first dosage of about 1E12 cm$^{-2}$ or more and about 6E12 cm$^{-2}$ or less.

15. The method of claim 14, wherein the first boron implantation process comprises a first implantation energy of about 450 keV and a first dosage of about 3E12 cm$^{-2}$.

16. The method of claim 4, wherein the second boron implantation process comprises a second implantation energy of about 500 keV or more and about 800 keV or less, and a second dosage of about 5E11 cm$^{-2}$ or more and about 2E12 cm$^{-2}$ or less.

17. The method of claim 16, wherein the second boron implantation process comprises a second implantation energy of about 550 keV, and a second dosage of about 1E12 cm$^{-2}$.

18. The method of claim 4, wherein the wafer comprises a high resistivity substrate and an RF region, wherein the n-well mask covers the RF region, the p-well regions, and the isolation regions of the wafer, wherein removing the n-well mask exposes the RF region, and wherein the second boron implantation process provides p-type dopants to the RF region.

19. The method of claim 2, wherein the wafer comprises a high resistivity substrate and an RF region, wherein the n-well mask covers the RF region, the p-well regions, and the isolation regions of the wafer, and wherein implanting the second p-type dopants comprises implanting second p-type dopants to the RF region.

20. The method of claim 1, wherein selectively implanting the first p-type dopants is done after selectively implanting the n-type dopants into exposed n-well regions of the wafer while the n-well mask overlies the wafer.

21. A method of forming wells in a semiconductor wafer, comprising:
 forming an isolation structure in an isolation region of the wafer;
 forming a p-well mask over the wafer, the p-well mask covering an n-well region, the isolation region, and an RF region of the wafer and exposing a p-well region of the wafer;
 selectively implanting p-type dopants into the exposed p-well region of the wafer while the p-well mask overlies the wafer;
 removing the p-well mask;
 forming an n-well mask over the wafer, the n-well mask covering the p-well region, the isolation region, and the RF region of the wafer and exposing the n-well region of the wafer;
 selectively implanting n-type dopants into the exposed n-well region while the n-well mask overlies the wafer; and
 selectively implanting first p-type dopants into the exposed n-well region while the n-well mask overlies the wafer.

22. The method of claim 21, further comprising:
 removing the n-well mask after selectively implanting the n-type dopants into the exposed n-well region; and
 implanting second p-type dopants into the p-well region, the n-well region, the isolation region, and the RF region of the wafer.

23. A method of forming wells in a highly resistive substrate of a semiconductor wafer, comprising:
 forming an isolation structure in an isolation region of the substrate;
 selectively implanting p-type dopants into a p-well region of the substrate to form a p-well therein;
 selectively implanting n-type dopants into an n-well region of the substrate to form an n-well therein;
 selectively implanting first p-type dopants into the n-well region to selectively decrease a substrate resistivity in the n-well region of the substrate beneath the n-well; and
 implanting second p-type dopants into the isolation region of the substrate beneath the isolation structure.

24. The method of claim 23, wherein selectively implanting the first p-type dopants into the n-well region comprises performing a first boron implantation process while an n-well mask overlies the wafer to cover the p-well and isolation regions of the substrate to provide first p-type dopants in the n-well region of the substrate beneath the n-well.

25. The method of claim 24, wherein implanting the second p-type dopants comprises performing a second boron implantation process with no mask overlying the wafer.

* * * * *